United States Patent [19]

Lloyd et al.

[11] Patent Number: 5,272,445
[45] Date of Patent: Dec. 21, 1993

[54] RESISTANCE TESTER UTILIZING REGULATOR CIRCUITS

[75] Inventors: Steven G. Lloyd, Hudson; Hamid Partovi, Westborough, both of Mass.

[73] Assignee: Digital Equipment Corp., Maynard, Mass.

[21] Appl. No.: 907,372

[22] Filed: Jul. 1, 1992

[51] Int. Cl.$^5$ .............................. G01R 27/14
[52] U.S. Cl. ......................... 324/706; 324/705; 324/713; 340/661
[58] Field of Search .......... 324/706, 713, 715, 705, 324/714; 340/660, 661

[56] References Cited

U.S. PATENT DOCUMENTS

| | | | |
|---|---|---|---|
| 1,324,818 | 12/1919 | Hazard | 324/706 |
| 1,931,054 | 10/1933 | Butterfield | 324/706 |
| 1,951,461 | 3/1934 | Wilson | 324/706 |
| 2,153,989 | 4/1939 | Paulson | 324/706 X |
| 2,369,070 | 2/1945 | Nielsen | 324/706 X |
| 2,432,390 | 12/1947 | Darby | 324/706 |
| 2,468,625 | 4/1949 | Goetz | 324/706 |
| 2,482,196 | 9/1949 | Marye | 324/706 |
| 2,846,646 | 8/1958 | Van Santen | 324/706 |
| 2,849,115 | 8/1958 | Tooker | 209/551 |
| 2,874,351 | 2/1959 | Lamont | 324/706 |
| 2,908,862 | 10/1959 | Patchell | 324/705 X |
| 2,946,950 | 7/1960 | Zomber | 324/706 |
| 3,060,379 | 11/1962 | Osvold | 324/706 |
| 3,181,061 | 4/1965 | Schneider | 324/705 |
| 3,254,299 | 5/1966 | Butler, Jr. | 324/705 |
| 3,284,707 | 11/1966 | Clinton | 324/133 |
| 3,689,832 | 9/1972 | Leto et al. | 324/707 |
| 3,784,906 | 1/1974 | Ironside | 324/706 |
| 3,810,007 | 5/1974 | Wiseman et al. | 324/706 |
| 3,848,185 | 11/1974 | Hentschel | 324/714 |
| 3,990,066 | 11/1976 | Malmgren | 324/706 |
| 4,057,755 | 11/1977 | Piesche | 324/714 X |
| 4,081,744 | 3/1978 | Ray | 324/706 |
| 4,426,617 | 1/1984 | Forrester | 324/705 |
| 5,055,269 | 10/1991 | Palumbo et al. | 324/706 |

FOREIGN PATENT DOCUMENTS 0828114  5/1981  U.S.S.R. .............. 324/706

Primary Examiner—Kenneth A. Wieder
Assistant Examiner—Glenn W. Brown
Attorney, Agent, or Firm—Cesari and McKenna

[57] ABSTRACT

A portable resistance tester comprises a pair of regulator circuits used to drive a bridge circuit and a detector circuit when measuring the resistance values of "in-circuit" test nodes. The tester produces an audible signal when the resistance of a measured test node falls within, or without, a predetermined resistance range.

7 Claims, 1 Drawing Sheet

RESISTANCE TESTER UTILIZING REGULATOR CIRCUITS

FIELD OF THE INVENTION

This invention relates generally to testing devices and, more specifically, to a tester for measuring and comparing resistance values.

BACKGROUND OF THE INVENTION

Modern computer systems typically utilize high-density packaging techniques which enable many components to be mounted on a printed circuit (PC) board. The components are typically mounted to the surfaces of the PC board and are interconnected via multiple signal and power conductors in layers internal to the board. These surface-mounted components are thereafter connected to components mounted on other boards of the system by signal wires of a system bus, thereby resulting in a significant number of signal connections throughout the system. For a high speed computer system using, e.g., emitter-coupled logic (ECL) technology, these signal connections are terminated at nodes, i.e., test nodes, usually having a uniform resistance value. A variation from that value may be an indication of loss of signal integrity.

During production of the computer system, an audit of the resistances at these test nodes is typically performed by a technician to insure proper design and manufacture of the system. Because of the high-density packaging techniques employed with the multi-layer PC boards, short (and open) circuit connections internal to the boards and between components mounted on the boards are difficult to detect visually. Accordingly, the technician checking the system must examine every test node to verify proper electrical signal connections throughout the system. This typically includes checking each test node of a fully-populated PC board for a particular resistance value. Such testing is known as "in-circuit" testing. For example, a short-circuit connection between two signal wires, each of which is terminated with a 50Ω resistor, presents a resistance value of 25Ω at a test node for either wire, instead of the expected 50Ω value.

One tool that is commonly used to measure resistances is an ohmmeter. The ohmmeter is a simple instrument that applies a fixed voltage across two resistors in series, e.g., a resistor of known value and a resistor whose value is being measured. The current through the known resistor is measured by a voltmeter, which is calibrated in terms of resistance values and has a display scale that indicates such values. However, visual inspection of the scale can prove cumbersome and time-consuming when the technician is auditing a significant number of test nodes in a computer system.

Another tool used to measure resistances is a conventional, multi-purpose volt-ohm-millimeter (VOM) meter, i.e., "multimeter". Although the multimeter features a "continuity" setting that beeps when a short-circuit or very small ohmic value is detected, it is not configured to detect any arbitrary value of resistance.

U.S. Pat. No. 3,784,906 discloses a multiple null bridge circuit with test leads for determining whether the value of a resistor is within a predetermined tolerance range. The bridge circuit includes high-impedance amplifiers to reduce bridge loading. However, the open-circuit voltage at the test leads is approximately 10 volts; this is unacceptable for most in-circuit testing applications because such a voltage level may be sufficient to activate or even damage certain active components on the PC board.

In addition, this bridge circuit includes a visual indicator interface to display the category of a manufactured resistor during trimming operations. Specifically, a "steady-state" illumination of the "GO" lamp indicates a desired resistance value. If the measurement of a "HIGH" resistance value immediately precedes measurement of a "LOW" value, all three indicators are illuminated prior to settling at the desired "LOW" state, thus requiring prolonged observance of the lamps.

Therefore, it is among the objects of the present invention to provide a resistance testing device that produces an audible signal upon detection of a predetermined resistance value.

Another object of the present invention is to provide a portable resistance testing device that is adapted for "in-circuit" testing applications.

SUMMARY OF THE INVENTION

Briefly, a resistance tester constructed in accordance with the invention comprises a pair of regulator circuits used to drive a bridge circuit and a detector circuit when measuring the resistance values of "in-circuit" test nodes. In accordance with a feature of the invention, an audible signal is produced when the resistance of a measured node falls within a predetermined resistance range.

The bridge circuit is a conventional balanced-bridge and includes test leads for probing the test nodes and means for varying the tolerance range of the tested nodes. The detector circuit includes a pair of comparators connected to logic circuitry via a pair of time-constant networks. Each regulator comprises an operational amplifier coupled to a transistor for converting the dc output voltage from a battery to levels needed for biasing the test leads and for driving the logic circuitry.

When the test leads are connected to a test node having a resistance value equivalent to a known reference of the tester, the bridge is in a balanced state. This condition activates the detector circuit, which, in turn, drives the logic circuitry to excite a buzzer. If the resistance value of the tested node does not match the reference, an imbalance in the bridge is created, thereby deactivating the detector circuit and disabling the buzzer.

In summary, an advantage of the resistance tester is the audible signalling that is provided upon correct measurement of a programmed resistance value. As an added feature of the invention, the programmed resistance value and the tolerance range of the tested node resistances are adjustable. Also, one of the regulator circuits delivers to the test leads a voltage at a reduced level such as to enable "in-circuit" testing without turning-on or damaging the components of a populated printed circuit board.

Moreover, audible signalling of the resistance tester, in conjunction with its portability, provides significant advantages, as explained below. Portability of the tester, which is made possible by the regulator circuits, further increases the utility of the tester when verifying connections in awkward or hard-to-reach places, e.g., inside a computer chassis. For this situation, a technician need simply listen for an audible signal as an indication that a resistance value is detected, thus obviating a need to observe a display scale. In response to the signal (or lack thereof), the tested node can be marked or flagged for further evaluation. If the measured resistance value is other than the reference value, no signalling will occur and the technician may continue probing test nodes, preferably by "sweeping" the test leads across the nodes.

BRIEF DESCRIPTION OF THE DRAWINGS

The above and further advantages of the invention may be better understood by referring to the following description in conjunction with the accompanying drawing, in which.

DETAILED DESCRIPTION OF ILLUSTRATIVE EMBODIMENTS

Figure 1:
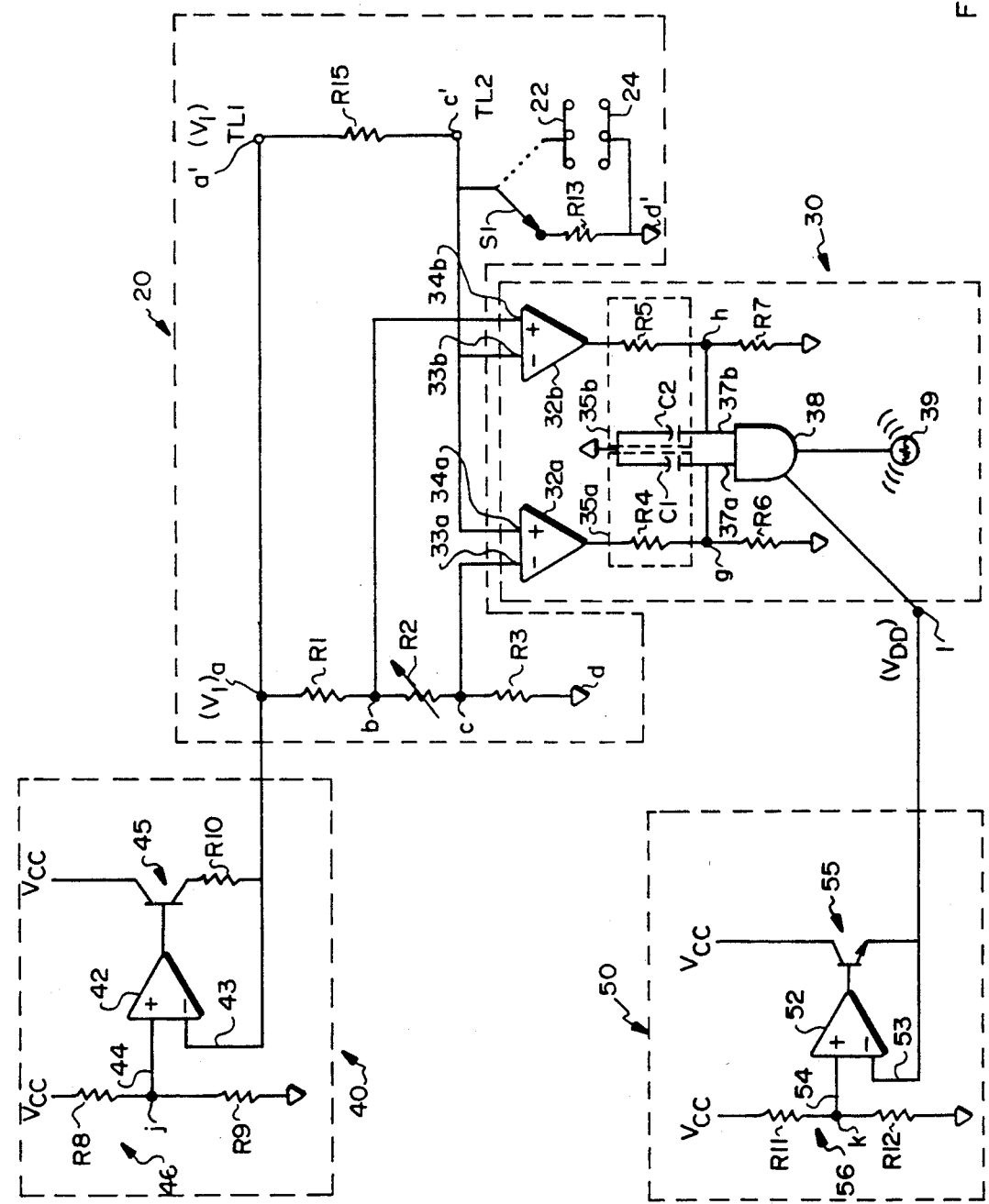
FIG. 1 is a detailed circuit schematic of a resistance tester in accordance with the invention.

FIG. 1 is a detailed circuit schematic of a resistance tester 10 comprising a bridge circuit 20, a detector circuit 30 and a pair of regulator circuits 40 and 50. Power is provided to these circuits by a battery, designated $V_{cc}$, whose output voltage is adjusted by the regulator circuits 40 and 50 to levels acceptable to the former circuits 20 and 30. As described further herein in accordance with an exemplary embodiment of the invention, the tester 10 incorporates a quad, operational amplifier semiconductor device powered by a 9-volt battery, which is adjusted by the regulator circuits to 5.0 volts for the logic circuitry used in the detector circuit and to 0.25 volts for the circuitry of the bridge circuit.

The bridge circuit 20 is of conventional balanced-bridge construction and comprises known resistors R1, R2 and R3 connected together along a first branch defined by nodes abcd, and known reference resistor R13 coupled to an unknown resistance value, designated as resistor R15, along a second branch of nodes a'c'd'. Specifically, nodes a,a' have a voltage potential of $V_1$ and nodes d,d' are connected to ground. When R2 is equal to zero Ω, the balanced condition of circuit 20 is achieved if the voltage $V_1$ is divided by resistors R1 and R3 in the same ratio as by resistors R13 and R15, $$(R15/R13)=(R1/R3)$$

In an exemplary embodiment of the invention, R1 and R3 are equal, e.g., 10K Ω resistors; therefore, at balance, the value of the unknown resistor R15 is equal to the reference resistor R13, $$R15 = R13$$

The bridge circuit 20 also includes input terminals 22 and 24, test leads TL1 and TL2, and trim resistor R2. Terminals 22 and 24 are connected in parallel across R13 and coupled to points c' and d', respectively, through switch S1. This arrangement allows for insertion of additional resistors to effectively vary the value of the reference resistor R13. The test leads TL1 and TL2 are connected to the bridge circuit 20 at nodes a' and c', respectively, and are adapted for connection to points external to the circuit 20 at those nodes. Trim resistor R2 is preferably a variable resistor that is connected between R1 and R3 at nodes b and c. As a feature of the invention, R2 provides a means for varying the tolerance range of the unknown resistor R15, as described further below.

The detector circuit 30 comprises a pair of voltage comparators 32a,b connected to logic circuitry 38 via a pair of time-constant networks 35a,b. Each comparator 32 is preferably an operational amplifier circuit having a low differential offset voltage between its two inputs, one of which is at a constant reference voltage and the other being a measurement voltage. Specifically, the reference voltages are applied to the inverting terminal 33a of comparator 32a and the noninverting terminal 34b of comparator 32b; these input terminals are connected to nodes c and b, respectively, of the bridge circuit 20. The measurement voltages are applied to the noninverting terminal 34a of comparator 32a and the inverting terminal 33b of comparator 32b, both of which are connected to node c' of the bridge 20.

Functionally, the measurement signals are compared to the reference signals and the outputs of the comparators are logical "0" or "1" states, depending upon the results of the comparisons. For the exemplary embodiment, these states are represented by 0 and 9 volt outputs, although it is understood that other voltages may be used that are compatible with circuitry of other testers.

The outputs of the comparators 32a,b are applied to resistors R4 and R5, which are elements of time-constant networks 35a,b. The networks 35 are conventional resistor-capacitor (RC) circuits configured to prevent accidental excitation of a buzzer 39 when probing test nodes having resistance values close to or at either end of the tolerance range of the desired resistance value. Each network 35a,b also includes a capacitor C1, C2 connected between ground and a resistor R4, R5 at node g, h, respectively. In an exemplary embodiment of the invention, R4 and R5 are 100 Ω resistors and C1 and C2 are 2 nanofarad capacitors, resulting in a time constant period of 20 microseconds.

Resistors R4 and R5 are further connected to resistors R6 and R7 at nodes g and h, respectively, to provide a voltage-divider network. Specifically, nodes g and h are connected to the inputs 37a,b of logic circuitry 38, which is preferably an AND gate, to provide input voltages acceptable to the gate 38. For example, when the comparators 32 present logical "1"s at their outputs, the resulting output voltages are 9 volts. These levels typically exceed the maximum input voltages for the logic gate 38. For the exemplary embodiment disclosed herein, R6 and R7 are 100 Ω resistors and the input voltages to the gate 38 are thus 4.5 volts. The output of the AND gate 38 is connected to a conventional buzzer circuit 39.

Each regulator circuit 40, 50 comprises an operational amplifier 42, 52 coupled to a bipolar transistor 45, 55. The circuits 40 and 50 convert the $V_{CC}$ voltage level to reduced voltages needed for the test leads, TL1 and TL2, and for driving the logic gate 38. This allows use of a small, 9-volt battery with the tester 10, thereby providing a portable unit. Specifically, the regulator circuit 40 provides a reference voltage $V_1$ of 0.25 volts at node a to ensure that the voltage across the test leads TL1 and TL2 does not inadvertently activate or damage any in-circuit components. Similarly, the regulator circuit 50 provides a "$V_{DD}$" voltage of 5.0 volts at node l to power the logic gate 38.

The bases of the transistors 45, 55 are connected to the outputs of the amplifiers 42, 52 and the collectors of the transistors are connected to $V_{CC}$. The inverting terminal 53 of the amplifier 50 is directly connected to the emitter of the transistor 55, while the inventing terminal 43 of amplifier 40 is coupled to the emitter of transistor 45 through resistor R10. R10 functions to limit the current flowing through the test leads TL1 and TL2 when they are "shorted" together.

The noninverting terminals of the amplifiers 42, 52 are connected to voltage-divider networks 46, 56, at nodes j and k, respectively. Network 46 includes resistor R8 connected between $V_{CC}$ and node j, and resistor R9 connected between node j and ground. Similarly, network 56 includes resistors R11, connected between $V_{CC}$ and node k, and R12 connected between node k and ground. In the exemplary embodiment of the invention, R8 is 87.5K $\Omega$, R9 is 2.5K $\Omega$, R11 is 40K $\Omega$ and R12 is 50K $\Omega$. Thus, for $V_{CC}$ equal to 9 volts, the noninverting terminal 44 of amplifier 42 is at a potential of 0.25 volts and the input terminal 54 of amplifier 52 is at a potential of 5.0 volts.

In operation, the test leads TL1 and TL2 are connected to a test node having an unknown resistance value to effectively add R15 to the bridge circuit 20. If the value of R15 equals R13 and if R2 is equal to a very small ohmic value, the bridge circuit is effectively in a "null" state and the voltages applied to the inputs of the comparators 32 are sufficient to produce logical "1" states at their outputs. This, in turn, produces a logical "1" at the output of the AND gate 38 and excites the buzzer circuit. Substantially all other values of R15 under these circumstances will produce a logical "0" at the outputs of one of the comparators and the AND gate, thereby negating excitation of the buzzer.

The addition of R2 to the first branch of the bridge circuit generally increases the range of "matching" unknown resistance values in a manner that is substantially proportional to the ratio of R2 to R3 (R1). In other words, for the exemplary embodiment where R3 (R1) is equal to 10K $\Omega$ and R13 is equal to 25 $\Omega$, the addition of R2 equal to 1K $\Omega$, i.e., 10% of R3, extends the range of matching unknown resistance values of R15 from 25 $\Omega$ to between 27.5 $\Omega$ and approximately 22.5 $\Omega$.

The circuitry described herein can be implemented on a small printed circuit board, thereby providing a portable and accurate resistance tester. Operational amplifiers are used as elements of the regulator circuits to allow generation of a small reference voltage for, e.g., the test leads. As noted, this ensures that "in-circuit" testing does not inadvertently activate protection diodes or damage active devices on the circuit boards under test. However, it should be noted that the magnitude of the reference voltage at $V_1$ must be greater than the differential offset input voltages of the comparators to ensure proper operation of the circuit.

In addition, the RC circuits coupled to the outputs of the comparators 32 prevent inadvertent audible signalling when sweeping the test leads across test nodes while testing resistance values that are close to the actual reference values. This is illustrated by the following example of an audit, which is indicative of a typical application of the resistance tester disclosed herein.

Assume the tester 10 is configured to detect a resistance of 25$\Omega$. If a first tested node has a resistance of 30$\Omega$, the voltages present at the inputs of the detector circuit 30 create an imbalance state as among the outputs of the comparators, e.g., the output of comparator 32b is a "1" and the output of comparator 32a is a "0". This negates the output of the AND gate 38 and there is no audible signalling from the buzzer 39. A second node subsequently tested has a resistance of 20$\Omega$, thereby producing a logical "1" at the output of comparator 32a while generating a "0" at the output of comparator 32b. However, as the voltage drop across the test leads change, the voltages applied to the inputs of the detector circuit transition through the null state, causing excition of the buzzer circuit and a resulting false "matched" indication. Ordinarily, a technician would halt the audit of the computer to determine whether the audible indication is permanent, thereby decreasing productivity.

The time-constant networks of the invention are directed to eliminating this problem. By choosing a predetermined value of capacitance for C1 and C2, the RC circuit provides a time period sufficient to filter the inadvertent signal prior to the signal reaching the input terminals to the AND gate; this effectively eliminates false signalling. Specifically, the values of the RC elements should not produce a charge/discharge time period that is so long as to inhibit the sweeping action of the test leads during the audit by filtering desired matched indication signals present at the outputs of the comparators and intended for input to the AND gate. In accordance with a further aspect of the invention, the small offset voltages presented to the inputs of the comparators, i.e., <0.25 volts, increase the rate of decay provided by the RC circuits.

The foregoing description has been directed to a specific embodiment of this invention. It will be apparent, however, that variations and modifications may be made to the described embodiment, with the attainment of some or all of its advantages. Therefore, it is the object of the appended claims to cover all such variations and modifications as come within the true spirit and scope of the invention.

What is claimed is:

1. A portable resistance tester comprising:
   a bridge circuit including a reference resistance value and including test leads for connecting to an unknown resistance value, said bridge circuit further configured to provide a matched condition when said unknown resistance value is equal to said reference value;
   a detector circuit including a plurality of comparator circuits having inputs coupled to said bridge circuit and outputs coupled to logic circuitry configured to excite a buzzer circuit in response to one of said matched condition and a no-matched condition; and
   a plurality of regulator circuits having inputs coupled to a battery and outputs coupled to said bridge and detector circuits,
   wherein one of said regulator circuits is configured to convert the output voltage of the battery to a first predetermined voltage level at said test leads and the other of said regulator circuits is configured to convert the output voltage of the battery to a second predetermined voltage level at said logic circuitry.

2. The resistance tester of claim 1 wherein said detector circuit further comprises a plurality of time-constant networks coupled between said comparator circuits and said logic circuitry to prevent excitation of said buzzer circuit in the absence of one of said matched condition and said no-matched condition.

3. A portable resistance tester comprising:
   a bridge circuit including a reference resistance value and including test leads for connecting to an unknown resistance value, said bridge circuit further configured to provide a matched condition when said unknown resistance value is equal to said reference value;
a detector circuit including a plurality of comparator circuits having inputs coupled to said bridge circuit and outputs coupled to logic circuitry configured to excite a buzzer circuit in response to one of said matched condition and a no-matched condition, said detector circuit further comprising a plurality of time-constant networks coupled between said comparator circuits and said logic circuitry to prevent excitation of said buzzer circuit in the absence of one of said matched condition and said no-matched condition;
a first regulator circuit having an input coupled to a battery and an output coupled to said bridge circuit so as to convert the output voltage of the battery to a first predetermined voltage level at said test leads; and
a second regulator circuit having an input connected to the battery and an output connected to said detector circuit so as to convert the output voltage of the battery to a second predetermined voltage level at said logic circuitry.

4. The resistance tester of claim 3 wherein said bridge circuit further comprises means for varying the tolerance range of said unknown resistance value.

5. The resistance tester of claim 4 wherein said bridge circuit further comprises means for varying the value of said predetermined reference value.

6. The resistance tester of claim 5 wherein said tolerance varying means comprises a trim resistor.

7. A portable resistance tester for use during in-circuit testing operations, said tester comprising:
a bridge circuit including a predetermined reference resistance value and including test leads for connecting to an unknown resistance value, said bridge circuit further configured to provide a matched condition when said unknown resistance value is equal to said reference value;
a detector circuit including a plurality of comparator circuits having inputs coupled to said bridge circuit and outputs coupled to logic circuitry configured to excite a buzzer circuit in response to one of said matched condition and a no-matched condition, said detector circuit further comprising a plurality of time-constant networks, each of which is connected between each of said comparator circuits and said logic circuitry to prevent excitation of said buzzer circuit in the absence of one of said matched condition and said no-matched condition; and
a plurality of regulator circuits having inputs coupled to a battery and outputs coupled to said bridge and detector circuits,
wherein one of said regulator circuits is configured to convert the output voltage of the battery to a voltage level at said test leads that is acceptable for in-circuit testing operations and the other of said regulator circuits is configured to convert the output voltage of the battery to a voltage level compatible with said logic circuitry.

* * * * *